United States Patent [19]

Navabi et al.

[11] Patent Number: 5,642,078
[45] Date of Patent: Jun. 24, 1997

[54] AMPLIFIER HAVING FREQUENCY COMPENSATION BY GAIN DEGENERATION

[75] Inventors: Mohammad J. Navabi; Baker P. L. Scott, III, both of Austin, Tex.

[73] Assignee: Crystal Semiconductor Corporation, Austin, Tex.

[21] Appl. No.: 535,977

[22] Filed: Sep. 29, 1995

[51] Int. Cl.$^6$ ................................ H03F 3/45; H03G 3/30
[52] U.S. Cl. .......................... 330/253; 330/254; 330/255; 330/259
[58] Field of Search ..................... 330/136, 253, 330/254, 255, 259, 270, 290, 298, 265

[56] References Cited

U.S. PATENT DOCUMENTS

| | | | |
|---|---|---|---|
| 4,316,149 | 2/1982 | Yamaguchi | 330/255 X |
| 4,833,423 | 5/1989 | Molloy | 330/265 |
| 4,857,861 | 8/1989 | Seevinck et al. | 330/255 |
| 4,963,837 | 10/1990 | Dedic | 330/255 X |
| 5,117,200 | 5/1992 | Scott, III | 330/253 |
| 5,157,349 | 10/1992 | Babanezhad | 330/253 |

FOREIGN PATENT DOCUMENTS

| | | | |
|---|---|---|---|
| 587965 | 3/1994 | European Pat. Off. | 330/254 |
| 136506 | 6/1991 | Japan | 330/254 |
| 647847 | 2/1979 | U.S.S.R. | 330/265 |

OTHER PUBLICATIONS

"A Low-Output-Impedance Fully Differential Op Amp with Large Output Swing and Continuous-Time Common-Mode Feedback" by Joseph N. Babanezhad, IEEE Journal of Solid-State Circuits, vol. 26, No. 12, Dec. 1991.

Primary Examiner—James B. Mullins
Attorney, Agent, or Firm—Steven K. Barton; Robert R. Mallinckrodt; J. P. Violette

[57] ABSTRACT

An amplifier having an inverting and a non-inverting input and at least one output is compensated by dynamically varying the transconductance of a gain stage in accordance with the gain of the output stage of the amplifier. The amplifier comprises a gain section having at least one output, where a gm of the gain section varies with a transconductance control signal. The amplifier further comprises an output stage comprising a output drive device controlled by an output of the gain section. A bias control circuit is coupled to drive the transconductance control input of the gain section, the bias control circuit increasing a differential mode transconductance of the first gain stage when the active pullup or pulldown output drive device has low gain.

20 Claims, 8 Drawing Sheets

AMPLIFIER HAVING FREQUENCY COMPENSATION BY GAIN DEGENERATION

BACKGROUND OF THE INVENTION

1. Field of the Invention

The present application pertains to integrated circuit amplifier circuits and more particularly, to compensation techniques for ensuring stability of CMOS line driver and large signal operational amplifier circuits.

2. State of the Art

The integrated operational amplifier was introduced in the early 1970's, and has become commonplace in modern electronics. These amplifiers typically have a differential input amplifier, conversion circuitry that produces a single-ended signal from the output of the differential input stage, in many cases a second gain stage, and an output driver. While these amplifiers were originally fabricated with bipolar technology, they are now frequently fabricated in CMOS processes. These amplifiers are often combined in a system with a feedback circuit connected between the amplifier output and the amplifier input, where the feedback circuit provides a negative feedback to the amplifier inputs and controls the overall transfer function of the system.

Amplifier circuits having two or more gain stages and having negative feedback around the amplifier (or operated in a closed loop) may become unstable or marginally stable with severe ringing. If the loop gain (the gain of the amplifier times the transfer function of the feedback circuit) is greater than one at the frequency where the feedback signal has a 180-degree phase shift, the feedback signal will regenerate itself and the circuit becomes unstable. If the loop gain at this frequency is close to one, undesirable ringing may occur.

A typical two-stage amplifier without output buffering has an open loop transfer function with two poles:

$$A(s) = Vo/Vi = \left( \frac{GMi\, R1}{1 + R1\, C1 s} \right) \times \left( \frac{GMo\, Ro}{1 + Ro\, Co s} \right) \quad \text{Equation 1}$$

where GMi and GMo represent the transconductance of the first and second stages, R1 and C1 are the resistance and capacitance that load the first stage, and Ro and Co are the resistance and capacitance that load the second stage. With feedback B(s), a loop gain of A(s) x B(s) is obtained, where the loop gain has at least two poles. Generally, these poles occur at different frequencies. The feedback signal asymptotically approaches its first 90 degrees of phase shift at a frequency a decade above the first, lowest frequency or dominant pole, and its second 90 degrees of phase shift at a frequency a decade above the second pole.

To ensure stability at all closed loop conditions, an amplifier must be compensated so that the unity gain bandwidth occurs at a frequency not substantially above the frequency of the second pole. This is typically done by adding a compensation capacitance to move the dominant pole of the transfer function to a lower frequency. Assuming that the first pole is the dominant pole, and that the frequency of the second pole is greater than the unity gain bandwidth, the gain bandwidth product (in radians) of the compensated amplifier is approximated by:

$$GBW\ (\text{radians}) = \frac{(GMi\, GMo\, Ro)}{Ctot} \quad \text{Equation 2}$$

where Ctot is the total effective compensation capacitance that loads the first stage plus C1.

In amplifier configurations with a non-buffered output where the current in the output stage is proportional to the output signal level, such as a class AB output stage driving a resistive load, the output stage gain varies with output signal level. This is because the gm (transconductance) of the MOS output devices changes as the square root of the current in those devices. The transconductance of bipolar output transistors changes proportional to output transistor current. When output currents are large, the amplifier gain is larger than when the amplifier is quiescently driving a very low current. An output stage having these characteristics is described by Babanezhad in U.S. Pat. No. 5,157,349, issued in October 1992.

The loop gain, the gain of the amplifier and the associated feedback circuitry combined, increases with the gain of the amplifier. Variation of the amplifier gain with signal level therefore complicates the compensation—if the amplifier is compensated properly for its largest output signal level, then it will have unduly limited bandwidth at the quiescent point. A compensation technique which can maintain a relatively constant unity gain bandwidth at all output voltages should be used.

Compensation of integrated operational amplifiers is often accomplished by adding a capacitor from the input to the output of the output stage of the amplifier. This takes advantage of the Miller multiplication effect to increase the effective capacitance of the capacitor. The capacitance moves the dominant pole to lower frequency and the second pole to a higher frequency resulting in better phase margin than the amplifier would have without the capacitor. In this scheme, the Miller effect allows a small capacitor (Cc) to be used because the effective capacitance (Ceff) is approximately equal to the voltage gain of the output stage times the capacitor's actual value.

Equation 3:

$$Ceff = Cc \times (1 + GMo \times Ro)$$

In this equation, GMo corresponds to the gm of the output device and Ro is the resistance seen by the output stage. Since the loop gain depends on the gain at this stage (GMo×Ro), any change in the gain will affect both the loop gain and the amount of compensation. For example, as the output signal increases, the current in the output stage increases, and the gain increases. This gain increase is accompanied by an increase in the effective capacitance which in turn shifts the dominant pole of the compensated amplifier to a lower frequency. The overall gain bandwidth will remain relatively constant except at very low output levels when the gain of the output stage is near or less than one.

In cases where the second stage uses large devices to accommodate large output currents, compensation using Miller capacitance becomes difficult. The large devices introduce large parasitic capacitances. At low bias current the output stage gain is low, with the result that the Miller multiplied feedback capacitance is small compared to the input capacitance of the output stage and thus ineffective at keeping a constant gain bandwidth product for the amplifier until the output stage gain reaches a large value. A large feedback capacitance can be used but more input transconductance is necessary to achieve a desired gain bandwidth product.

In integrated circuits, large capacitances occupy a large area of the die, require extra processing steps, or both. Circuit cost increases with the die area and with the number of processing steps, therefore either of these increases the cost of the circuit. Also, the larger required transconductance results in more power consumption and larger area. It is therefore desirable to compensate a high power amplifier with an alternative method which maintains a constant unity gain bandwidth and allowed large output swings but is more compact than Miller compensation as heretofore practiced.

SUMMARY OF THE INVENTION

The present invention comprises a technique for compensation of amplifiers that is particularly useful for amplifiers having a power driving common source or common emitter output stage. The amplifier of the present invention is embodied in the output amplifier circuit of a high-speed line driver.

It has been found that if the transconductance of the first stage of the amplifier is degenerated to lower the small signal AC gain of the amplifier, and thereby lower the overall loop gain, the unity gain bandwidth of the amplifier is reduced so that the second pole occurs well beyond the unity gain frequency.

Equation 2 shows that if the output transconductance (GMo) increases, the gain bandwidth product can be kept constant by either decreasing the input transconductance (GMi) or increasing the effective capacitance seen by the first stage. Transconductance degeneration can be dynamically varied as the signal levels within the amplifier change. As the input signal and expected output signal increase, and the gain of the class B or AB output amplifier increases, the degeneration is increased to lower the transconductance of the input stage and hold the overall gain bandwidth product of the amplifier substantially constant. In this way a relatively constant unity gain bandwidth for the multistage amplifier as a whole is maintained. Further, the amount of transconductance degeneration can be, and is, varied according to the polarity of the output signal to adjust for the inherent gm (transconductance) difference between the pullup and pulldown devices resulting from differences between the N-channel and P-channel device characteristics.

BRIEF DESCRIPTION OF THE DRAWINGS

The best mode presently contemplated for carrying out the invention is illustrated in the accompanying drawings, in which.

DETAILED DESCRIPTION OF THE INVENTION

Figure 1:
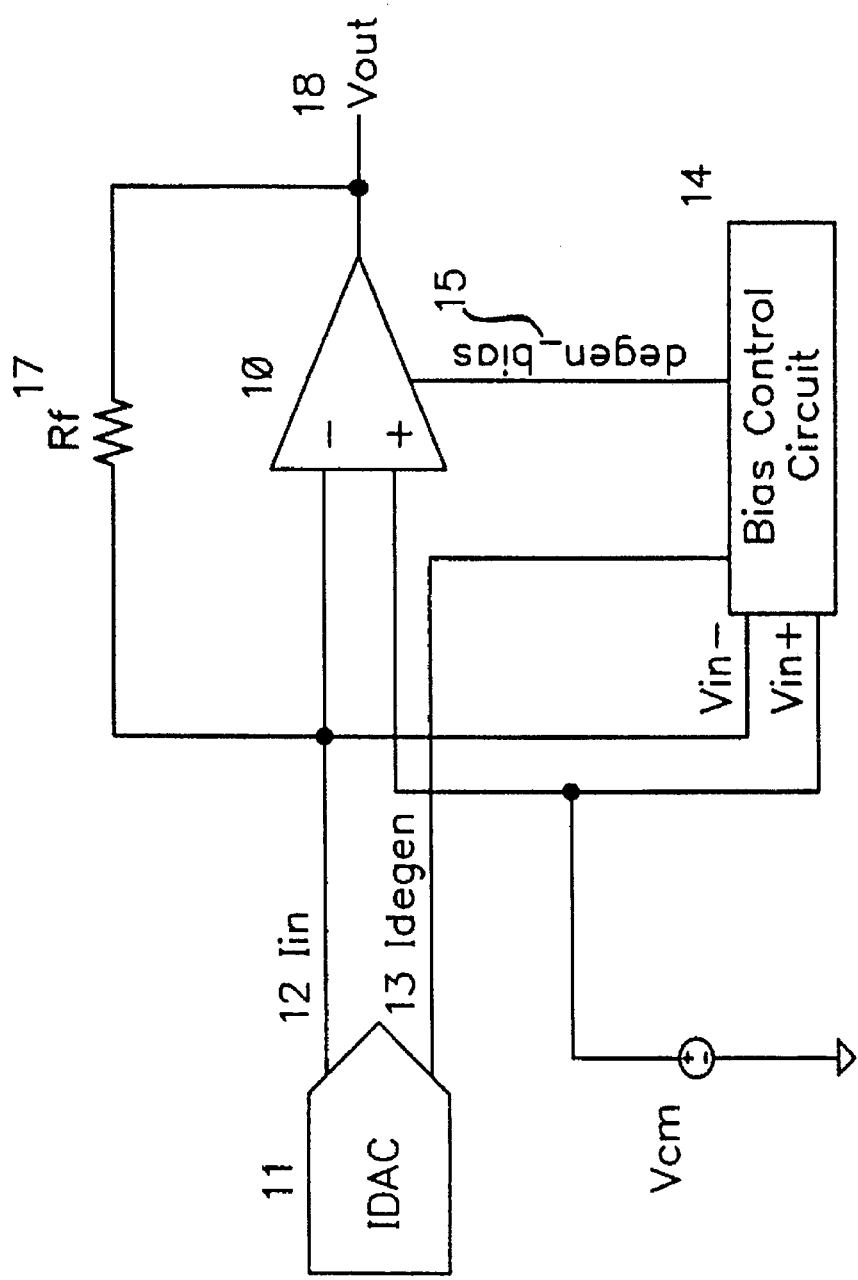
FIG. 1 is a schematic showing an amplifier embodying the present invention configured as a current-to-voltage conversion amplifier.

An amplifier 10 having negative feedback, compensated according to present invention, and coupled to perform current to voltage conversion, is illustrated in FIG. 1. IDAC 11, a current mode digital to analog convertor, provides an input current 12 signal to an inverting input of the amplifier 10 and also a degeneration control current 13 proportional to the absolute value of the input current 12 that is used to control a gain of the input stage of the amplifier 10.

The degeneration biasing circuit 14 provides a bias voltage 15 for a degeneration device 16 (FIG. 2) in the amplifier 10. A feedback resistor 17 (FIG. 1) provides negative feedback current from the output 18 of the amplifier to the inverting input of the amplifier 10.

Figure 2:
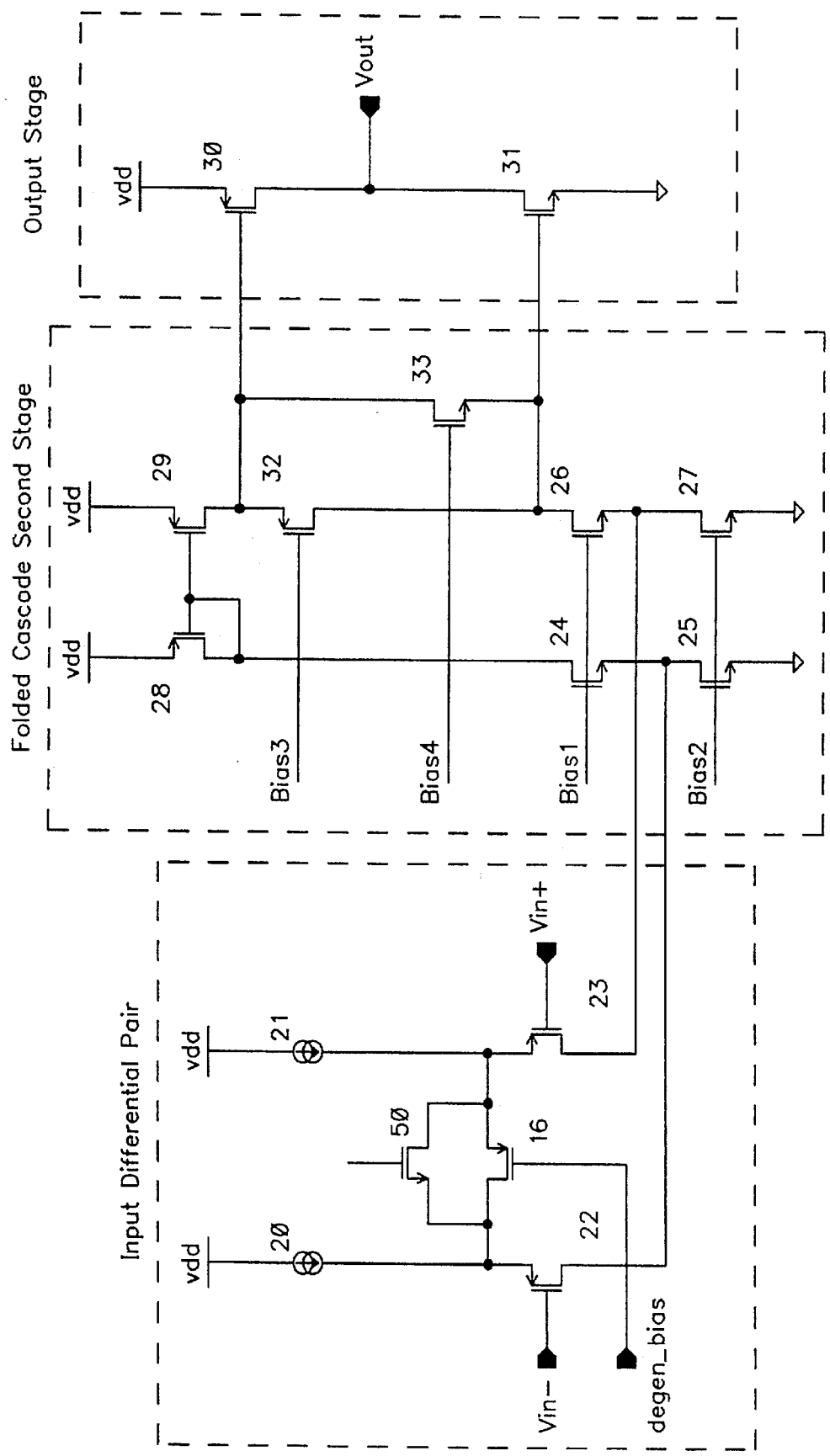
FIG. 2, a schematic of an amplifier compensated according to the present invention.

Amplifier 10 has a differential input stage comprising a pair of current sources 20 and 21 (FIG. 2) coupled together by gain degeneration device 16, and a differential pair 22 and 23. The gates of differential pair devices 22 and 23 are driven by the amplifier inverting VIN− and noninverting VIN+ inputs (FIG. 2). Differential mode transconductance (gm) of this differential input stage increases as the effective resistance of gm degeneration device 16 decreases. Amplifier 10 also has a folded cascode second gain stage comprising four devices biased in the conductive region 24, 25, 26, and 27, with a current mirror load comprising devices 28 and 29. The differential input stage and the folded cascode second stage may be referred to as the gain section of the amplifier. The term gain section is used to reference all gain stages of the amplifier except for the output stage.

Amplifier 10 also has a class AB output stage comprising P channel pullup device 30 and N channel pulldown device 31, with a pair of bias level setting devices 32 and 33. This output stage drives the output VOUT of the amplifier. The biasing circuits (not shown) of this output stage may be implemented in several ways, including the manner described in U.S. Pat. No. 5,157,349, issued to Babanezhad in October 1992.

The unity gain bandwidth of this amplifier assuming a predominantly single pole response can be simplified and expressed $$GBW(\text{radians}) = GMi \times GMo \times Ro/C$$

where GMi is the gm of the input devices 22 and 23 as degenerated by current through the effective resistance Rds of the degeneration device 16:

$$GMi = gm/(1 + gm \times Rds/2)$$

and GMo is the gm of the P-side or N-side output device depending on the polarity of the output signal, and depends on the output current level:

$$GMo = \begin{cases} gmp & \text{for } Vo > Vcm \\ gmn & \text{for } Vo < Vcm \end{cases}$$

where Vcm is a crossover voltage, and C is the total capacitance at the gate of the N-channel or the p-channel output device, and Ro is the effective output impedance of the cascode second stage amplifier.

Figure 3:
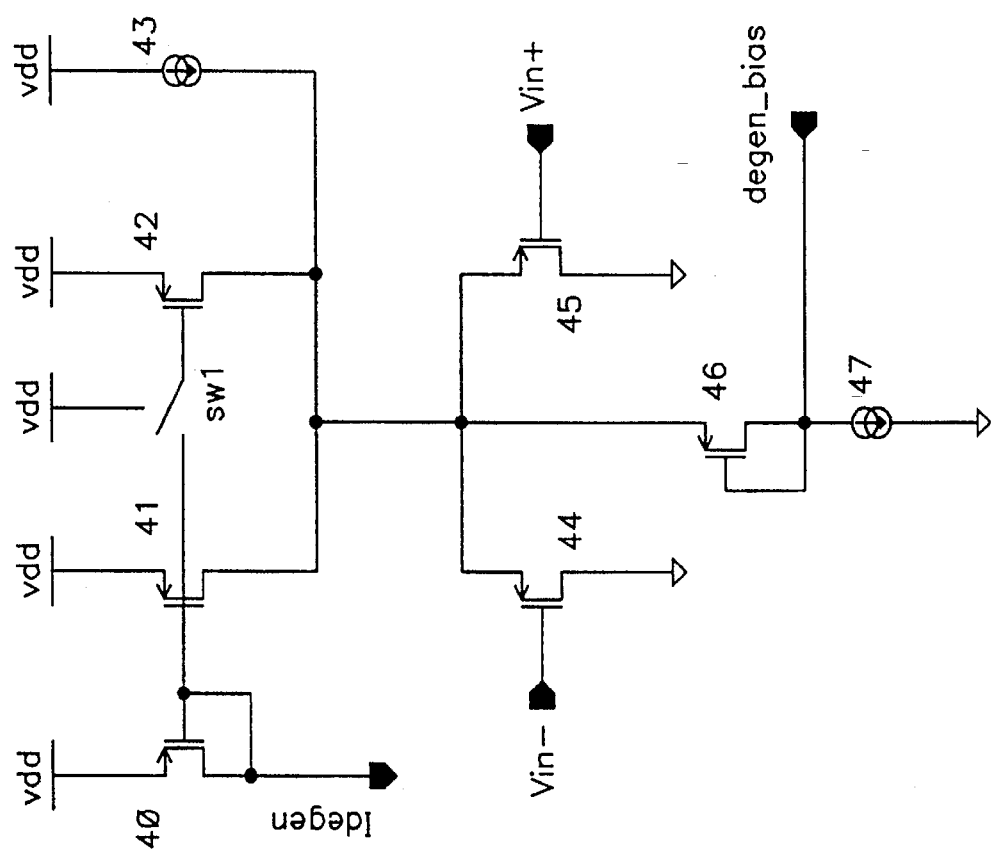
FIG. 3, a schematic of the degeneration bias circuit used to control the gm of the first stage of the amplifier.

The input signal for the amplifier 10 is a current 12 generated by IDAC 11 applied at the inverting input of the amplifier. A current 13, proportional to the absolute value of the input current, controls the degeneration bias circuit 14. It is assumed that the load on the amplifier is known and that this current is proportional to the current in the output devices. The degeneration control current 13 is mirrored and scaled by P-channel devices 40, 41, and 42 (FIG. 3). The scale factor of the current is adjusted through switching device SW1 according to the polarity of input signal 12. Switching device SW1 permits use of gain degeneration separately determined to be appropriate for use with the P-channel 30 and N channel 31 output devices. An offset current is added to the scaled degeneration control current by current source 43.

The scaled and offset degeneration control current is applied to the sources of a degeneration differential pair comprising devices 44 and 45, the gates of which are connected to the amplifier inverting and noninverting inputs respectively. This produces a gate-source voltage (Vgs) drop proportional to the square root of the degeneration control current. An offset voltage reflecting the threshold voltage of the devices as fabricated is applied by gate and drain (diode) connected transistor 46 and current source 47 to produce the degeneration bias signal 15 that controls the conductance gds16 of degeneration device 16 (FIG. 2) according to the approximate equation:

$$gds16 = (K' \times W/L)(Vgs - Vt - Vds)$$

Where K' is a process-dependant constant, Vt is the threshold voltage of the device, and Vds is the drain-source voltage of the device.

As shown by the above equation, the impedance gds16 depends on Vgs, so variations in the source voltages of the input differential pair, which could happen in a transient, could affect the value of gds16. The gates of the degeneration differential pair transistors 44 and 45 are connected to the inverting and noninverting inputs of the amplifier respectively to adjust the degeneration bias 15 for variations in the source voltages of the input differential pair.

Optionally, a switch device 50 may be added across the degeneration device to short out the resistance of the degeneration device or reduce its effective value when the amplifier is at zero output level and the output stage of the amplifier is known to have low gain. In this way, the effective bandwidth of the amplifier is not reduced by compensation when the compensation is not necessary.

Figure 4A:
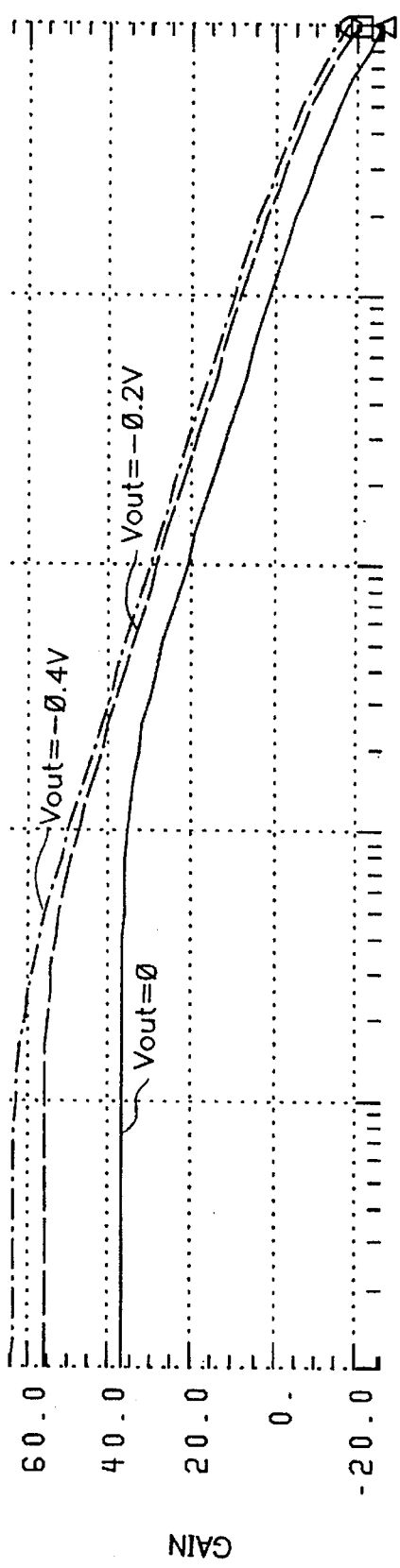
FIG. 4a, a plot of resistively compensated amplifier small signal gain in dB versus frequency at three different output signal levels.
Figure 4B:
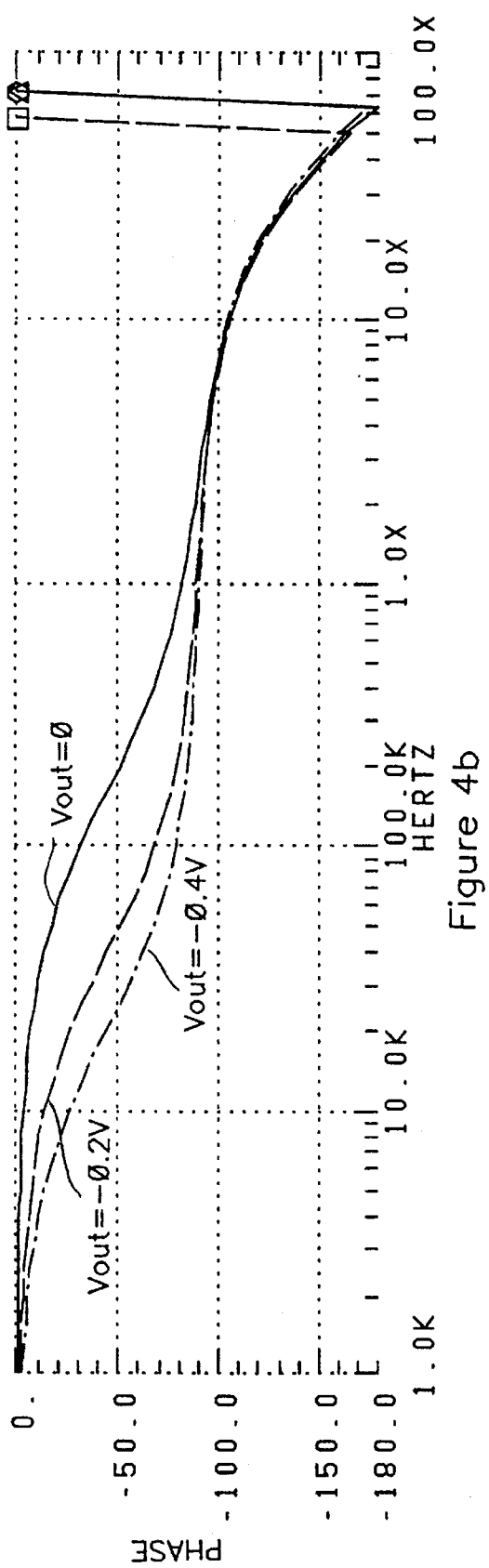
FIG. 4b, a plot of resistively compensated amplifier small signal phase shift in degrees versus frequency at three different output signal levels.

Small signal simulation results of an amplifier circuit utilizing this compensation technique are shown in FIGS. 4 and 5. FIG. 4a shows the amplifier's gain versus frequency when dynamic transconductance degeneration is not used, and FIG. 4b shows the same amplifier's phase versus frequency. As indicated in the plot, the amplifier has a gain-bandwidth product of 11.3 MHz and a phase margin of 72.9 degrees when the output is zero. The gain-bandwidth product increases to 23.9 MHz and the phase margin becomes 51.7 degrees when the output voltage is −0.2 V. Doubling the output voltage further increases the gain-bandwidth product to 29.1 MHz and lowers the phase margin to 47.1 degrees.

Figure 5A:
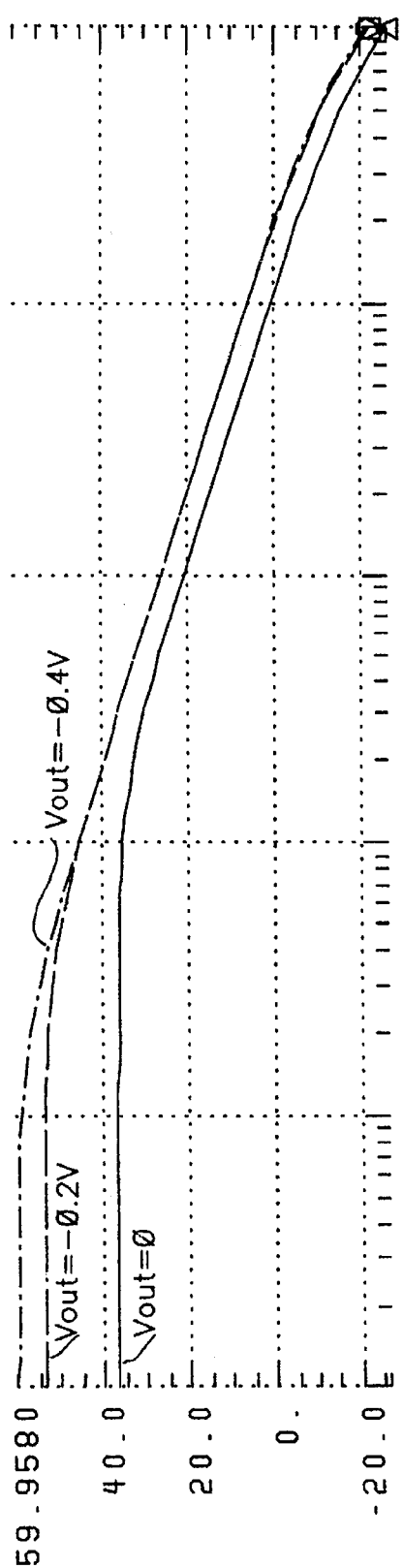
FIG. 5a, a plot of dynamically compensated amplifier small signal gain in dB versus frequency at three different output signal levels.
Figure 5B:
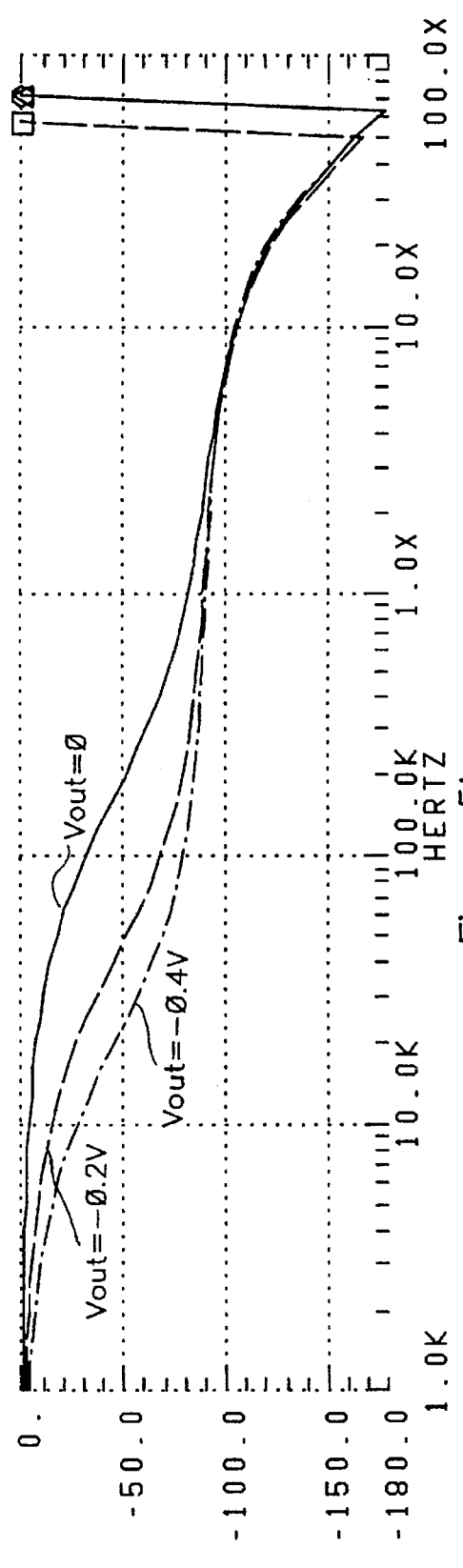
FIG. 5b, a plot of dynamically compensated amplifier small signal phase shift in degrees versus frequency at three different output levels.

FIG. 5 shows the frequency response of the amplifier with dynamic transconductance degeneration compensation. FIG. 5a shows gain versus frequency, and FIG. 5b shows phase versus frequency. Here the amplifier has a gain-bandwidth product of 11.1 MHz and a phase margin of 73.3 degrees when the output is zero, while the gain-bandwidth product increases to 19.3 MHz and phase margin becomes 59.2 degrees when the output voltage is −0.2 V. If the output voltage is doubled to −0.4 V, the gain-bandwidth product remains relatively constant (19.6 MHz), and the phase margin improves slightly to 61.4 degrees.

An alternative embodiment of the degeneration biasing circuit, for applications where the input signal level does not linearly correspond to the output, the load is not known, or a signal linearly related to the output signal is not available, derives the gain degeneration biasing signal from the output stage drive signals. A feedback circuit (FIG. 6) comprises a small P-channel sense device 40 with identical gate and source voltages to the P-channel pullup driver 30, and therefore sources a current roughly proportional to the current in the pullup driver 30. The current from this device 40 is mirrored by N-channel devices 41 and 42. Similarly, N-channel sense device 43 has the same gate and source voltages as the N-channel pulldown driver 31, and provides a current roughly proportional to the current in driver 31. The current in device 43 (proportional to the N-channel pulldown driver current) is added to the mirrored current in device 42 (proportional to the P-channel pullup driver current), and the sum is used as the gain degeneration reference current.

Different scaling of the pullup and pulldown current sense devices results in different gm degeneration for positive and negative signals as desired. The degeneration reference current is scaled and adjusted by a degeneration bias circuit like that of FIG. 3, but lacking switch SW1 and scaling device 42. This is necessary since this alternate embodiment (FIG. 6) does not rely on prior knowledge of the output signal amplitude or polarity. For the same reason, switch device 50 (FIG. 2) is not present in the amplifier of FIG. 6. It should be noted that the bandwidth of the degeneration biasing circuit of the present invention is comparable to the large signal bandwidth of the amplifier itself. The degeneration control signal degen_bias from the degeneration bias circuit is coupled to the gate of the degeneration device 16.

A feedback path is created when the output signal is applied to the degeneration device. The small signal input voltage of the degeneration device is a function of the output current and can be approximated as:

$$Vgs = K1 * io$$

Where K1 is a circuit dependant proportionality constant. The transconductance of the degeneration device is given by:

$$gmd = K'(w/l) * Vds$$

So, for non-zero Vds, the small signal gate to source voltage will result in a small signal current equal to:

$$gmd * Vgs^- = gmd * K1 * Io$$

This current and the output conductance of the degeneration device give rise to a feedback signal where the feedback factor Bd (beta sub d) is approximately $$Bd=(gmd*K1)/gds$$

The open loop gain (Ad) and first pole location (wpd) for the amplifier with the degeneration loop is given by:

$$Ad=Ao/(1+Ao*Bd); \quad wpd=wp*(1*Ao*Bd)$$

where Ao is the open loop gain and wp is the location of the first pole without degeneration feedback.

The above derivation indicates that feeding the output signal back to the degeneration device will lower the low frequency gain and move the dominant pole to higher frequency by a factor of (1+Ao*Bd). As long as the new pole position is still well below the second pole, the overall phase margin will remain dominated by the dominant pole and the gain bandwidth product remains constant.

Figure 6:
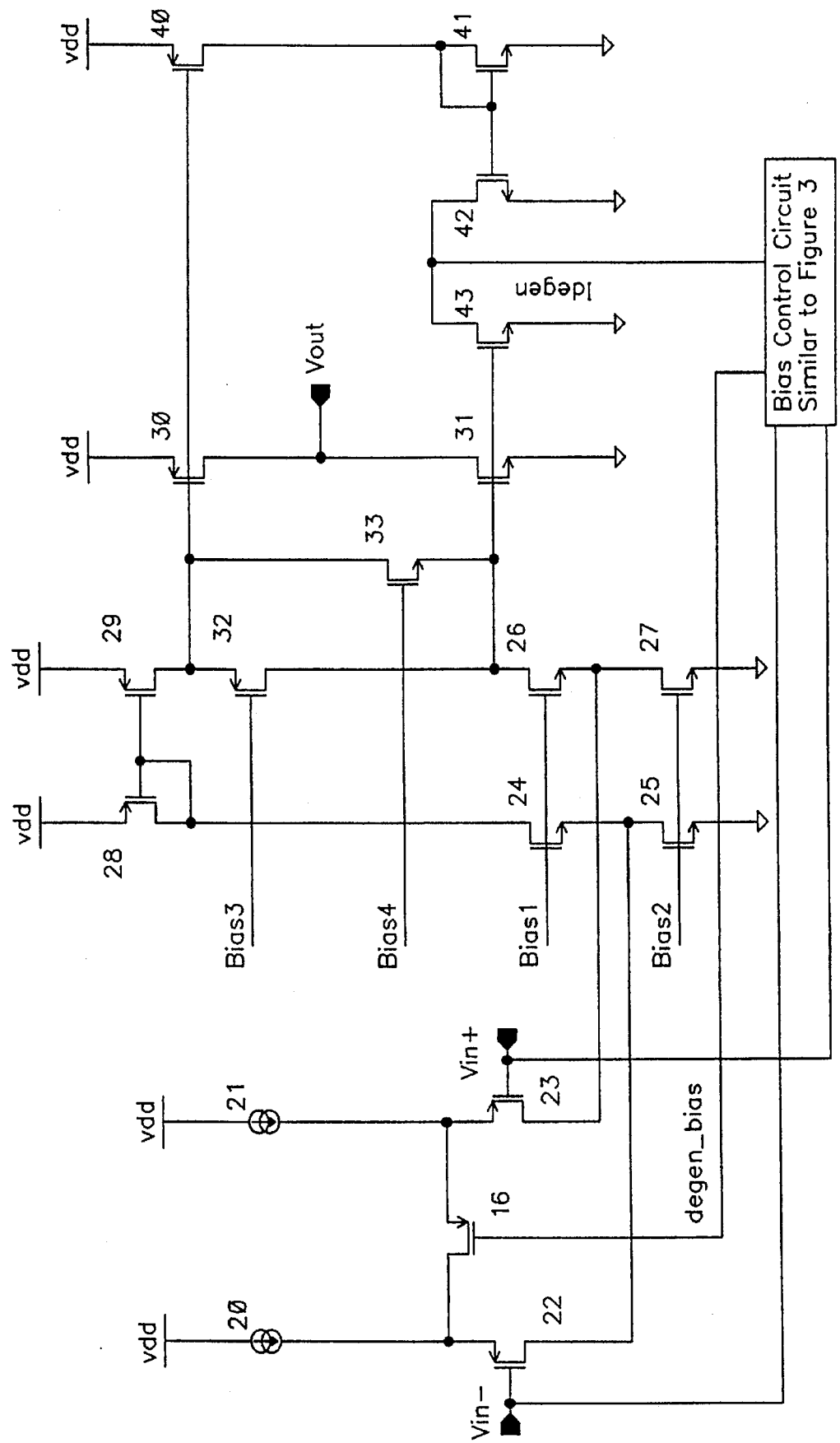
FIG. 6, a schematic diagram of an alternative embodiment of the invention wherein the gain degeneration is controlled by a current mirrored from the output devices.
Figure 7A:
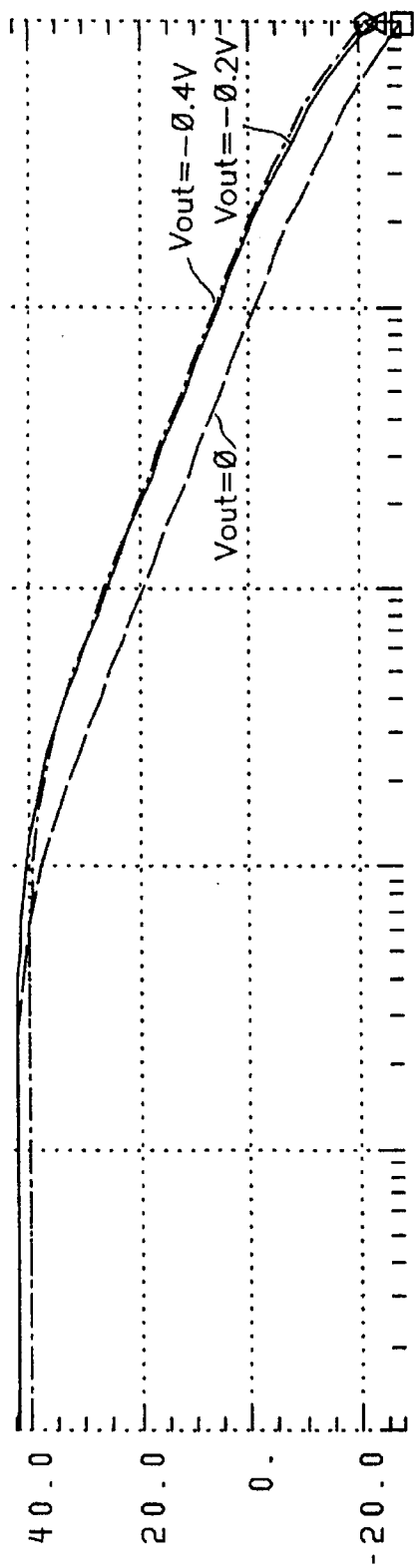
FIG. 7a, a plot of feedback compensated amplifier small signal gain in dB versus frequency at three different output signal levels.
Figure 7B:
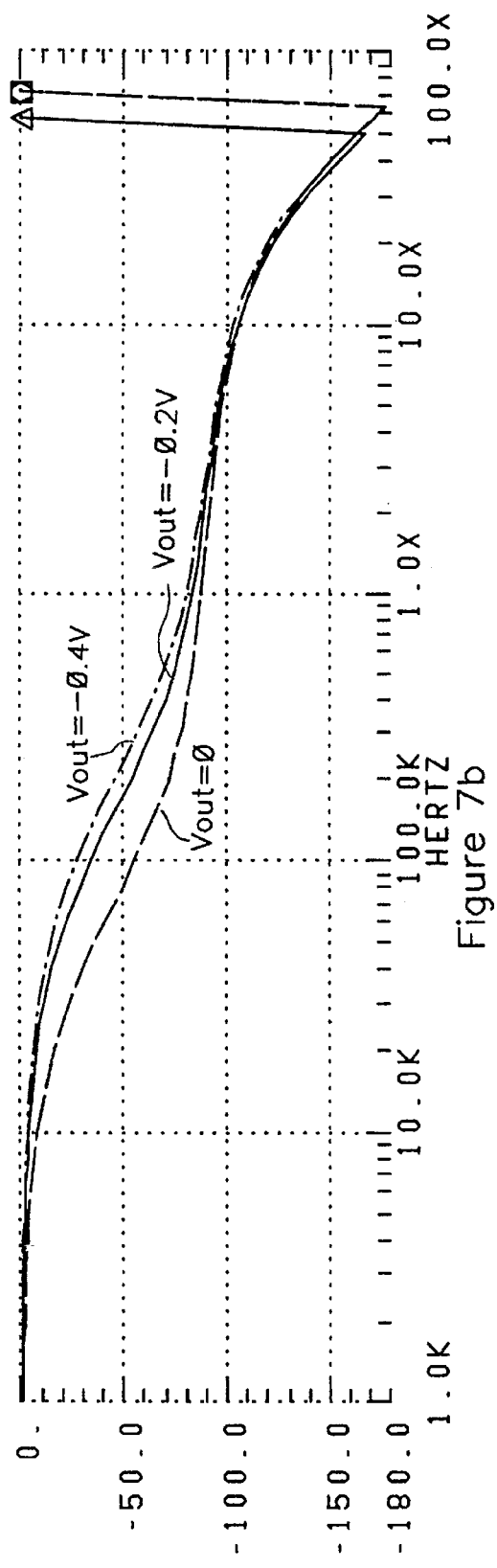
FIG. 7b, a plot of feedback compensated amplifier small signal phase shift in degrees versus frequency at three different output levels.

Gain and phase versus frequency plots for the amplifier of FIG. 6 are shown in FIG. 7A for gain, and FIG. 7B for phase. The resulting phase margins resemble those obtained when the bias signal is derived from the DAC, while the open loop gain is much lower. The amplifier when compensated with degeneration controlled by feedback from its output signal had a gain-bandwidth product of 19.0 MHz at an output level of −0.2 V, and 20.3 MHz at −0.4 V, with a nearly constant phase margin of 60.4 degrees.

Figure 8:
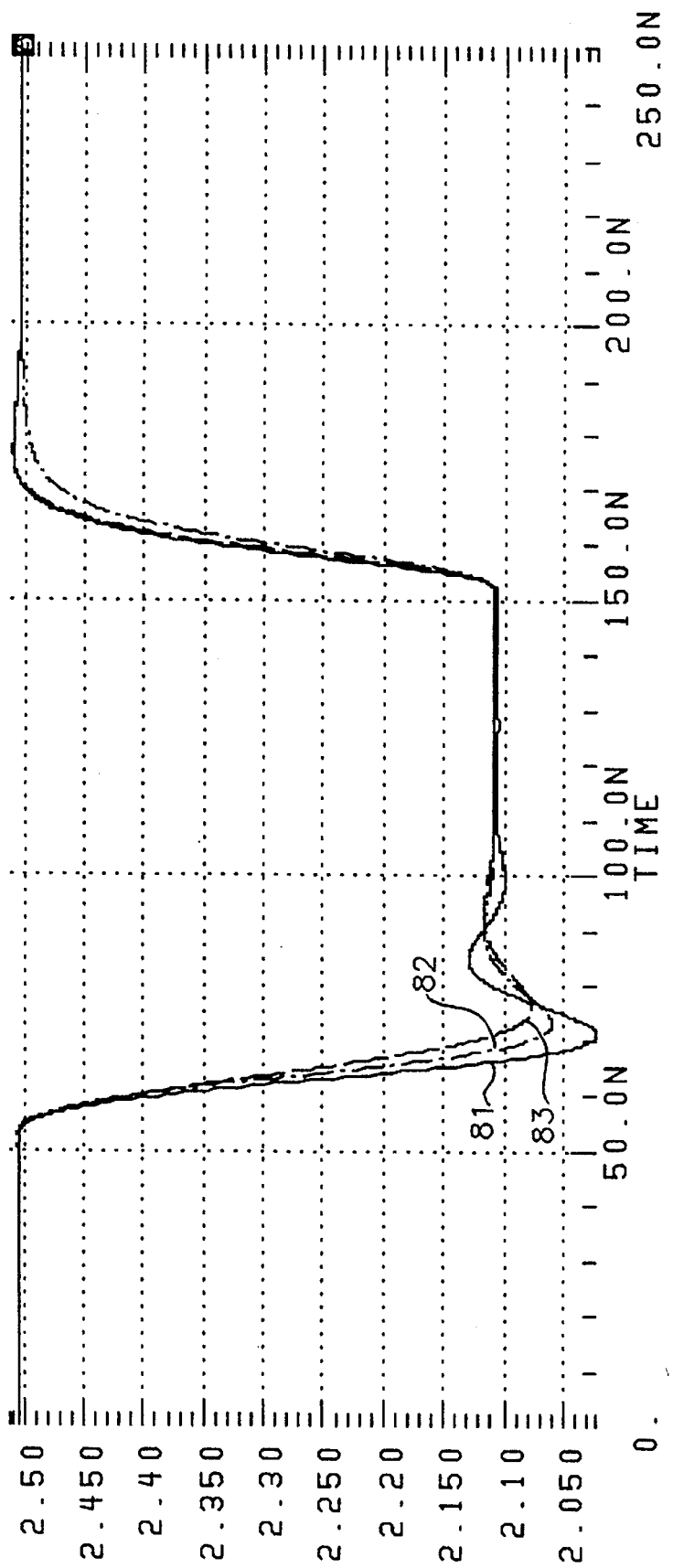
FIG. 8; a plot of the transient response of the amplifier, with constant degeneration compensation, with degeneration set by a DAC output, and with feedback-controlled degeneration.

The transient response of the amplifier is indicated in FIG. 8. The amplifier quiescent output level is 2.5 V. At the quiescent point the amplifier is drawing a low current and has its lowest bandwidth. The transient response having greatest overshoot 81 is that of the amplifier without compensation by dynamic transconductance degeneration. The response having an intermediate amount of overshoot 82 is that produced with compensation by dynamic transconductance degeneration controlled, as in the schematic of FIG. 6, in response to the currents in the class AB output stage of the amplifier. The response having the least amount of overshoot 83 is that produced with compensation by dynamic transconductance degeneration controlled, as in the schematic of FIG. 2, by an amplifier input proportional to the desired amplifier output signal, While this invention dynamically modifies the transconductance of the first stage by utilizing a degeneration device coupled between two current sources, other means of controlling the gain may be used. For example, a circuit can be used where the gain is adjusted by altering the bias current in the input stage. If the bias current is decreased inversely to the output signal currents, relatively constant gain can be obtained. This approach may, however, result in a reduced slew rate because the reduced bias current cannot charge the parasitic capacitances of the output devices as quickly as can an unreduced bias current.

Another amplifier topology having voltage-adjustable gain that may be suitable for the present invention would utilize a single current source feeding a pair of matched adjustable-resistance gain control devices, which in turn feed the sources of the differential pair. With this circuit, the greater the resistance of the transconductance control devices, the lower the transconductance of the first stage. Additionally, a differential multiplier circuit, such as a Gilbert cell multiplier, may be used as the first stage of the amplifier. The transconductance gain of the amplifier first stage is then dependant upon a second, multiplier, input corresponding to the degeneration bias signal derived from an input signal or fed back from the output current.

The present invention is applicable to applications other than digital to analog convertors. The implementation of FIG. 6 in particular is appropriate for general purpose, monolithic, operational amplifiers.

While the invention as described uses N and P channel MOS transistors, and is fabricated as a monolithic CMOS integrated circuit, the invention can also be implemented with other forms of transistors. Further, while the invention as disclosed uses P-channel devices in the differential pairs shown at devices 22, 23, 44, and 45, the invention will function with N-channel devices in these pairs if the polarities of the relevant current sources and power supplies are reversed.

While the invention as described uses a P-channel transistor as a voltage variable resistance device 16 to degenerate the transconductance of the input differential pair 22 and 23, other forms of fast-acting voltage or current controllable resistances will function in this circuit. In particular, the circuit will operate, if the polarity of the degeneration bias signal is altered appropriately, with a N-channel transistor serving as the voltage variable resistance device 16.

While the amplifier herein described uses a complimentary pair of MOS devices, bipolar transistors may be used as output drivers. The term "control input" for a transistor therefore encompasses the gate of a MOS device, and also the base of a bipolar transistor.

The compensation technique of the present invention may be combined with conventional Miller compensation when necessary to adequately compensate an amplifier. An amplifier utilizing both the transconductance degeneration compensation of the present invention and Miller compensation may require significantly less Miller compensation capacitance than would be required with Miller compensation alone.

Whereas this invention is here illustrated and described with reference to embodiments thereof presently contemplated as the best mode of carrying out such invention in actual practice, it is to be understood that various changes may be made in adapting the invention to different embodiments without departing from the broader inventive concepts disclosed herein and comprehended by the claims that follow.

I claim:

1. An amplifier having inverting and non-inverting inputs and at least one output comprising:

a gain section having a first and a second input coupled to receive the inputs of the amplifier and at least a first and a second output, where a transconductance of the gain section is a function of a transconductance control input;

a pullup output drive device having a control input coupled to the first output of the gain section and coupled to drive the at least one output of the amplifier;

a pulldown output drive device having a control input coupled to the second output of the gain section and coupled to drive the at least one output of the amplifier; and a bias control circuit for maintaining substantially a constant unity gain bandwidth of the amplifier across a range of output drive currents, the bias control circuit coupled to drive the transconductance control input of the gain section, the bias control circuit increasing a differential mode transconductance of the gain section when the active pullup or pulldown output drive device has a low transconductance.

2. The amplifier of claim 1, wherein the amplifier has a bias input, such that the bias control circuit is controlled in response to the bias input, the bias input coupled to receive a signal proportional to an expected output of the amplifier.

3. The amplifier of claim 1, wherein the bias control circuit is responsive to a current level in at least one of the output drive devices.

4. The amplifier of claim 1, wherein the transconductance control input of the gain section drives a gate of a transconductance control MOS device.

5. The amplifier of claim 4, wherein the transconductance control MOS device is coupled between the source of a first input device and the source of a second input device, where a gate of the first input device is coupled to the inverting input of the amplifier, a gate of the second input device is coupled to the non-inverting input of the amplifier, a first current source is coupled to the source of the first input device, and a second current source is coupled to the source of the second input device.

6. The amplifier of claim 1, wherein the bias control circuit is responsive to signal levels in the pullup device and in the pulldown output device of the amplifier.

7. The amplifier of claim 6, wherein the gain section further comprises a differential pair, and wherein the transconductance control input of the first gain stage drives the gate of at least one transconductance control MOS device coupled between the sources of the differential pair.

8. The amplifier of claim 7, wherein the at least one transconductance control MOS device is coupled between the source of a first input device and the source of a second input device of the differential pair, where a gate of the first input device is coupled to the inverting input of the amplifier, and a gate of the second input device is coupled to the non-inverting input of the amplifier.

9. The amplifier of claim 1, wherein the gain section further comprises at least two stages.

10. An amplifier having at least one input and at least one output comprising:

a gain section having at least one input coupled to receive the at least one input of the amplifier, at least one output, and having means for dynamically varying a transconductance of the gain section in response to a transconductance control signal;

an output drive stage coupled to receive the at least one output of the gain section, and to drive the output of the at least one output of the amplifier; and a bias control circuit coupled to drive the transconductance control signal of the gain section, where the bias control circuit drives the transconductance control signal of the gain section to adjust a transconductance of the gain section inversely with a gain of the output drive stage to hold the overall gain of the amplifier substantially constant over a range of operating conditions.

11. The amplifier of claim 10, wherein the gain section further comprises a first differential gain stage.

12. The amplifier of claim 10, further comprising Miller compensation circuitry.

13. The amplifier of claim 12, wherein the bias control circuit determines the gain of the output drive stage by monitoring the gate-source voltages of the pullup transistor and the pulldown transistor; and adjusts the transconductance of the gain section in response thereto.

14. The amplifier of claim 13, wherein the transconductance control input of the first gain stage drives a gate of a transconductance control MOS device.

15. The amplifier of claim 14, wherein the transconductance control MOS device is coupled between the source of a first differential input device and the source of a second differential input device, where a gate of the first differential input device is coupled to the inverting input of the amplifier, and a gate of the second differential input device is coupled to the noninverting input of the amplifier.

16. The amplifier of claim 15, wherein the gain section further comprises a second folded-cascode gain stage coupled to receive a signal from the drain of at least one of the differential input devices.

17. A method of compensating an amplifier having a gain section and an output stage, where a current in the output stage varies with output conditions or signal levels, and a transconductance of the output stage varies with the current in the output stage, comprising:

producing a control signal proportional to the current in the output stage; and using the control signal to control a transconductance of the gain section such that the transconductance of the gain section is reduced upon an increase of the transconductance of the output stage, and the transconductance of the gain section is increased upon a decrease of the transconductance of the output stage such that the overall phase margin of the amplifier remains substantially constant over a range of output conditions.

18. The method of claim 17, wherein the step of producing a control signal proportional to the current in the output stage is performed by a sensing circuit that monitors the current in the output stage and alters the control signal in response to changes in the current in the output stage.

19. The method of claim 18, wherein the output stage is an amplifier of a type selected from class AB and class B amplifiers.

20. The method of claim 17, wherein the output stage has a pullup device and a pulldown device, and wherein the step of producing a control signal proportional to the current in the output stage is performed by a sensing circuit that separately monitors a current in the pullup device of the output stage and a current in the pulldown device of the output stage, and the control signal depends on the sum of a first scale factor multiplied by the current in the pullup device of the output stage, and a second scale factor multiplied by the current in the pulldown device of the output stage.

* * * * *